US011832452B2

(12) United States Patent
Chuang et al.

(10) Patent No.: US 11,832,452 B2
(45) Date of Patent: Nov. 28, 2023

(54) SEMICONDUCTOR DEVICE

(71) Applicant: TAIWAN SEMICONDUCTOR MANUFACTURING COMPANY LTD., Hsinchu (TW)

(72) Inventors: Harry-Hak-Lay Chuang, Hsinchu County (TW); Wu-Chang Tsai, Hsinchu (TW); Tien-Wei Chiang, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 83 days.

(21) Appl. No.: 17/390,580

(22) Filed: Jul. 30, 2021

(65) Prior Publication Data

US 2021/0359001 A1  Nov. 18, 2021

Related U.S. Application Data

(63) Continuation of application No. 16/714,135, filed on Dec. 13, 2019, now Pat. No. 11,088,199, which is a continuation of application No. 15/486,756, filed on Apr. 13, 2017, now Pat. No. 10,510,802.

(51) Int. Cl.
| | |
|---|---|
| *H10B 61/00* | (2023.01) |
| *H01L 23/532* | (2006.01) |
| *H01L 23/522* | (2006.01) |
| *H10N 50/10* | (2023.01) |
| *H10N 50/01* | (2023.01) |

(52) U.S. Cl.
CPC ......... *H10B 61/00* (2023.02); *H01L 23/5226* (2013.01); *H01L 23/53295* (2013.01); *H10N 50/01* (2023.02); *H10N 50/10* (2023.02)

(58) Field of Classification Search
CPC ........ H01L 27/222; H01L 43/12; H10B 61/00
See application file for complete search history.

(56) References Cited

U.S. PATENT DOCUMENTS

| | | | | |
|---|---|---|---|---|
| 10,510,802 | B2* | 12/2019 | Chuang | ............. H01L 23/53295 |
| 11,088,199 | B2* | 8/2021 | Chuang | ............... H01L 23/5226 |
| 2009/0261433 | A1* | 10/2009 | Kang | ..................... H10N 50/01 |
| | | | | 257/E29.323 |
| 2015/0171314 | A1* | 6/2015 | Li | .......................... H01L 43/08 |
| | | | | 257/421 |

(Continued)

*Primary Examiner* — Alia Sabur
(74) *Attorney, Agent, or Firm* — WPAT LAW; Anthony King (57) ABSTRACT

A semiconductor device includes a first dielectric layer, a second dielectric layer and a memory device. The second dielectric layer includes a first layer and a second layer. The memory device includes a first conductive structure under the first dielectric layer, a second conductive structure over the second dielectric layer, and a memory cell between the first and the second dielectric layers. The memory cell includes a bottom electrode via, a bottom electrode over the bottom electrode via, a top electrode over the bottom electrode, a top electrode via over the top electrode, and a MTJ between the top electrode and the bottom electrode. The second layer of the second dielectric layer surrounds sidewalls of the top electrode via entirely. The first layer of the second dielectric layer surrounds sidewalls of the bottom electrode entirely, sidewalls of the MTJ entirely, and sidewalls of the top electrode entirely.

20 Claims, 11 Drawing Sheets

(56) References Cited

U.S. PATENT DOCUMENTS

| | | | |
|---|---|---|---|
| 2015/0249209 A1* | 9/2015 | Lu | H01L 43/02 257/421 |
| 2016/0093668 A1* | 3/2016 | Lu | H01L 23/5226 257/421 |
| 2018/0033957 A1* | 2/2018 | Zhang | H01L 43/12 |

* cited by examiner

SEMICONDUCTOR DEVICE

PRIORITY CLAIM AND CROSS-REFERENCE

This application is a continuation of U.S. patent application Ser. No. 16/714,135, filed on Dec. 13, 2019, entitled of "SEMICONDUCTOR DEVICE", which is a continuation of U.S. patent application Ser. No. 15/486,756, filed on Apr. 13, 2017, entitled of "SEMICONDUCTOR DEVICE AND METHOD OF MANUFACTURING THE SAME", the disclosure of which is hereby incorporated by reference in its entirety.

BACKGROUND

Electronic device such as memory device and peripheral device such as logic device normally have different electrical requirements such as capacitance requirements. It requires additional processes to form different dielectric layers in the memory device and in the logic device, and thus manufacturing cost and complexity are increased.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Figure 1:
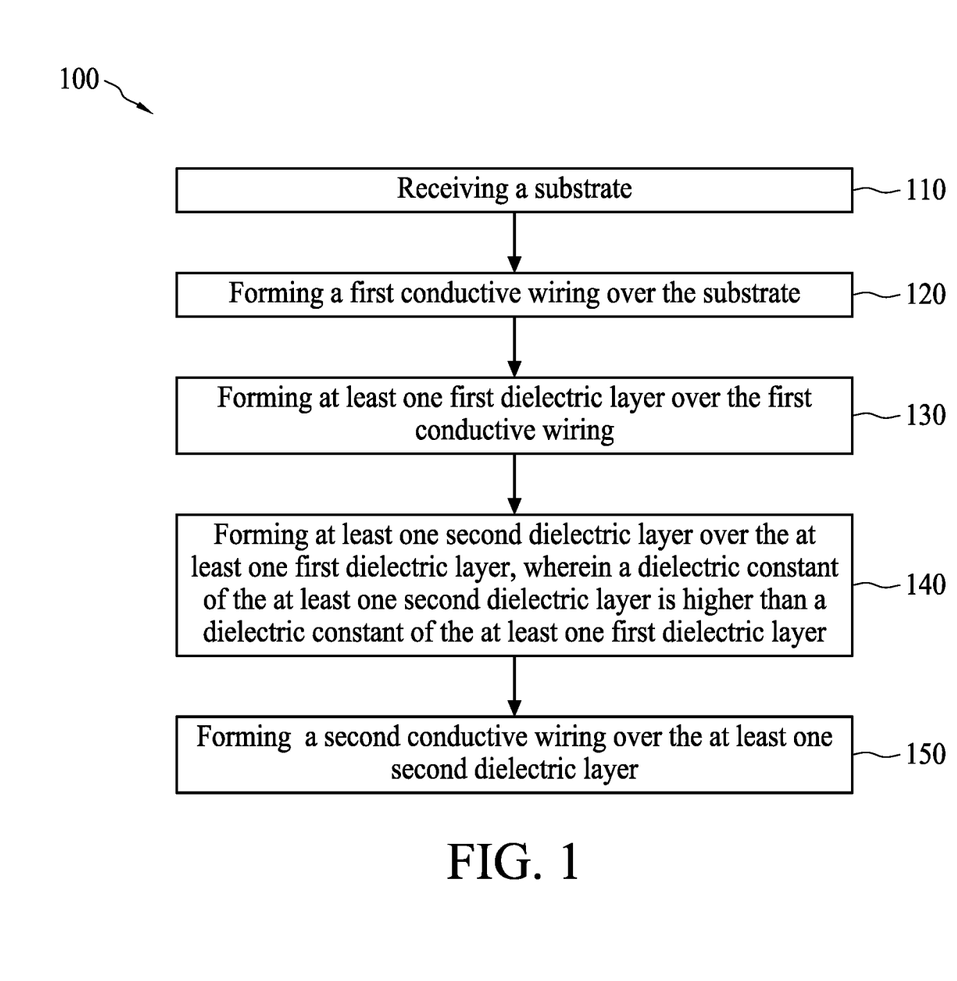
FIG. 1 is a flow chart illustrating a method for manufacturing a semiconductor device according to various aspects of one or more embodiments of the present disclosure.

FIG. 1 is a flow chart illustrating a method for manufacturing a semiconductor device according to various aspects of one or more embodiments of the present disclosure. The method 100 begins with operation 110 in which a substrate is received. The method 100 continues with operation 120 in which a first conductive wiring is formed over the substrate. The method 100 proceeds with operation 130 in which at least one first dielectric layer is formed over the first conductive wiring. The method 100 continues with operation 140 in which at least one second dielectric layer is formed over the at least one first dielectric layer, wherein a dielectric constant of the at least one second dielectric layer is higher than a dielectric constant of the at least one first dielectric layer. The method 100 proceeds with operation 150 in which a second conductive wiring is formed over the at least one second dielectric layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
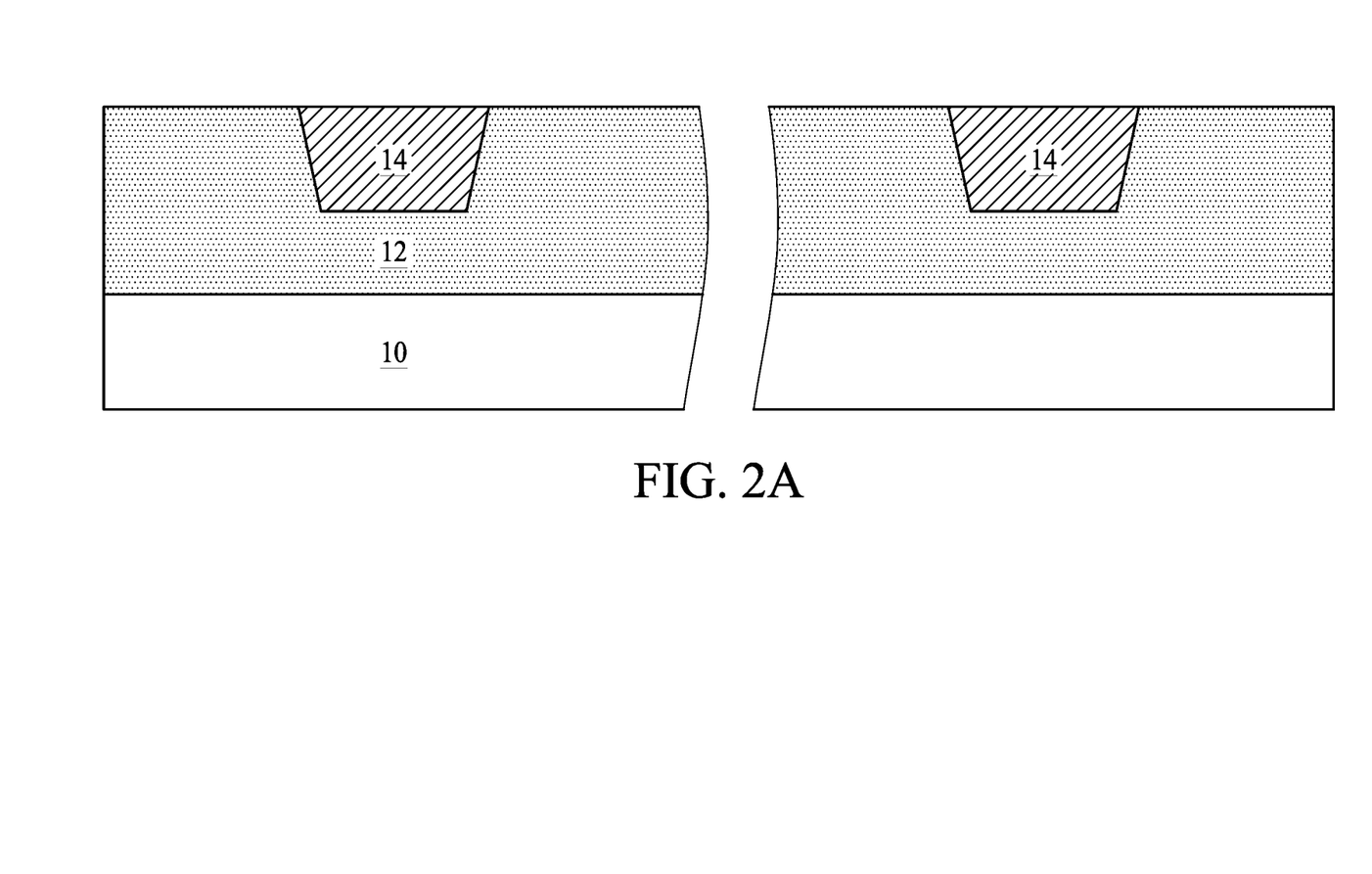
FIG. 2A, FIG. 2B and FIG. 2C are schematic views at one of various operations of manufacturing a semiconductor device according to one or more embodiments of the present disclosure.
Figure 2B:
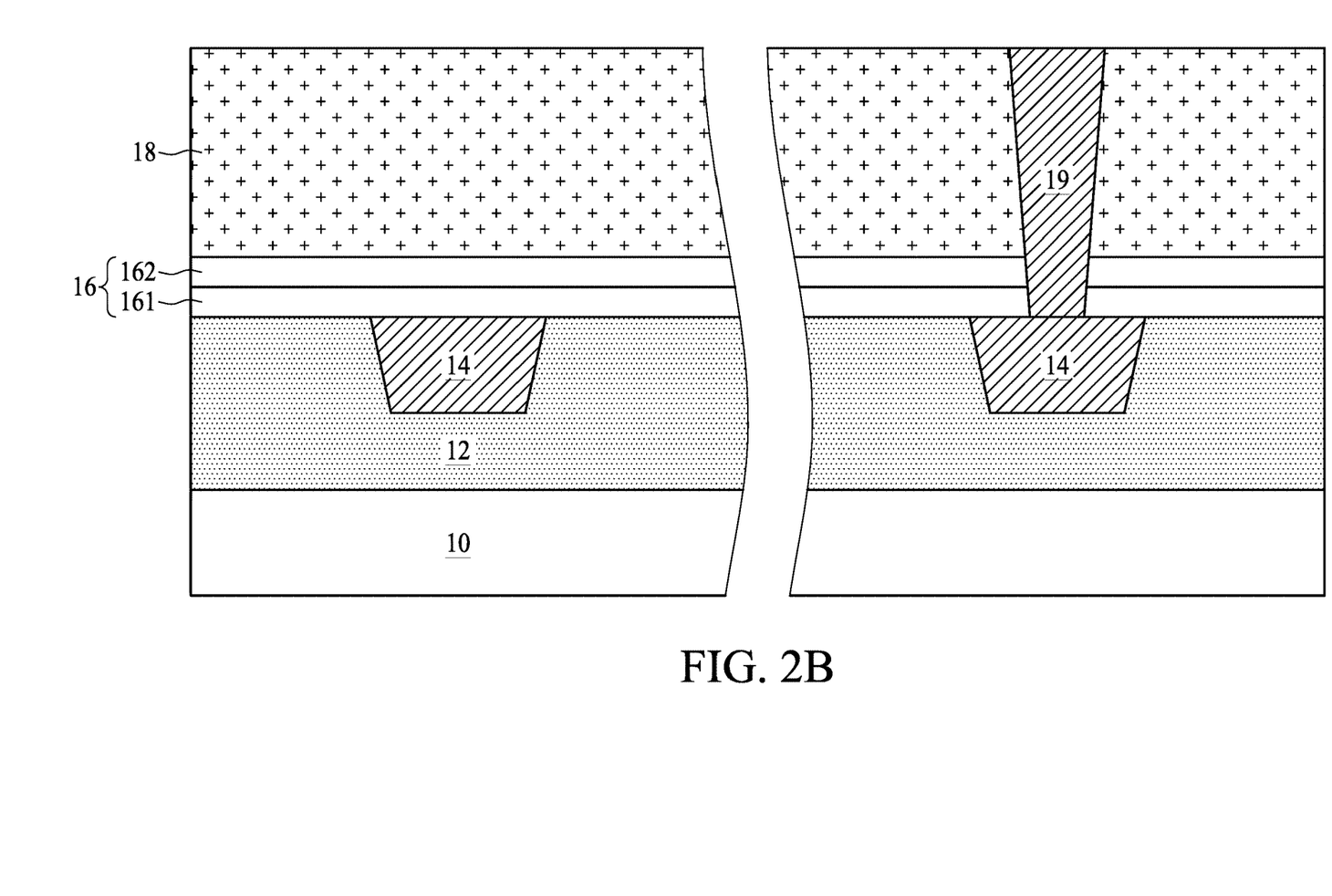
Figure 2C:
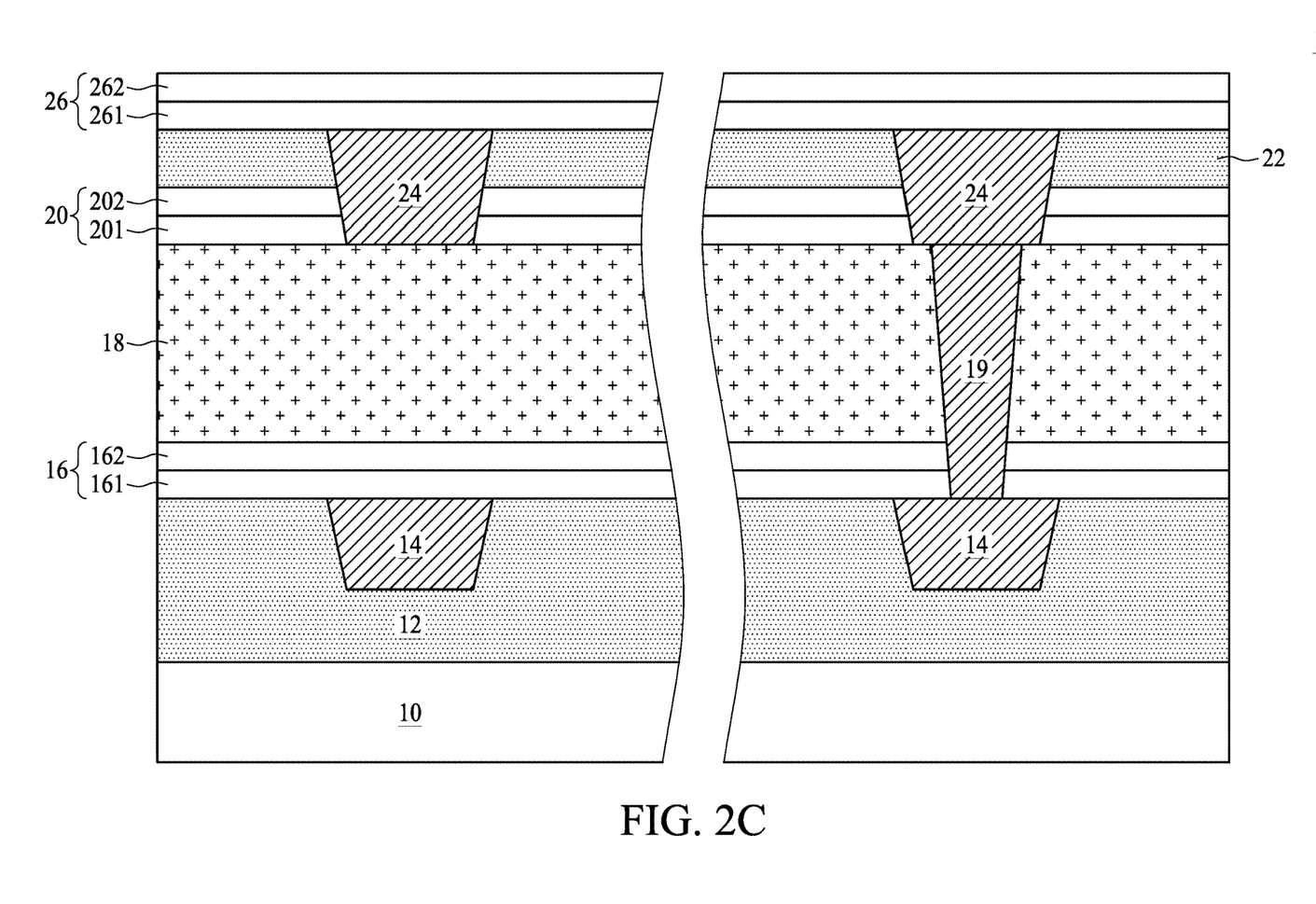

FIG. 2A, FIG. 2B and FIG. 2C are schematic views at one of various operations of manufacturing a semiconductor device according to one or more embodiments of the present disclosure. As depicted in FIG. 2A, a substrate 10 is received. In some embodiments, the substrate 10 includes a semiconductor substrate. By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof.

In some embodiments, a first low-k dielectric layer 12 is formed over the substrate 10. In some embodiments, the first low-k dielectric layer 12 is a low-k dielectric or an extreme low-k (ELK) dielectric having a dielectric constant equal to or less than about 3. In some embodiments, the material of the first low-k dielectric layer 12 may include, but is not limited to, a carbon-doped silicon oxide such as Black Diamond, CORAL or AURORA; a mixture of organic material and silicon oxide such as HOSP; Nanoglass; aluminum fluoride; bromine fluoride; combinations thereof; or other low-k or ELK dielectric materials. In some embodiments, the thickness of the first low-k dielectric layer 12 is ranging from about 1000 angstroms to about 1500 angstroms, but not limited thereto.

A first conductive wiring 14 is formed in the first low-k dielectric layer 12. In some embodiments, the first low-k dielectric layer 12 surrounds an edge of the first conductive wiring 14, and an upper surface of the first conductive wiring 14 is exposed from the first low-k dielectric layer 12. The first conductive wiring 14 is formed from conductive material such as metal or alloy. For example, the material of the first circuit layer includes copper, but not limited thereto.

As depicted in FIG. 2B, at least one first dielectric layer 16 is formed over the first low-k dielectric layer 12. The dielectric constant of the at least one first dielectric layer 16 is higher than the dielectric constant of the first low-k dielectric layer 12. In some embodiments, the dielectric constant of the at least one first dielectric layer 16 is ranging from about 3.5 to about 4.5, but not limited thereto. In some embodiments, the material of the at least one first dielectric layer 16 may include silicon oxide, silicon carbide, zinc oxide, titanium oxide, tantalum oxide, combinations thereof or the like. In some embodiments, the thickness of the at least one first dielectric layer 16 is ranging from about 50 angstroms to about 600 angstroms. In some embodiments, the at least one first dielectric layer 16 is a single-layered structure. In some embodiments, the at least one first dielectric layer 16 includes a first dielectric 161 and a second dielectric 162 stacked to each other and formed from different dielectric materials. In some embodiments, the first dielectric 161 is configured to improve adhesion with the underlying first low-k dielectric layer 12, and the second dielectric 162 is configured to improve adhesion with an overlying layer. In some embodiments, the thickness of the first dielectric 161 is ranging from about 50 angstroms to about 300 angstroms, and the thickness of the second dielectric 162 is ranging from about 50 angstroms to about 300 angstroms.

At least one second dielectric layer 18 is formed over the at least one first dielectric layer 16. In some embodiments, the dielectric constant of the at least one second dielectric layer 18 is higher than the dielectric constant of the at least one first dielectric layer 16. In some embodiments, the dielectric constant of the at least one second dielectric layer 18 is ranging from about 4 to about 7, but not limited thereto. In some embodiments, the material of the at least one second dielectric layer 18 may include silicon nitride, silicon oxynitride, aluminum oxide, asbestos, chloroform, tantalum oxide, combination thereof, or the like. In some embodiments, the at least one second dielectric layer 18 is a multi-layered dielectric. By way of example, the at least one second dielectric layer 18 may include oxide/nitride/oxide (ONO). The at least one second dielectric layer 18 may be single-layered or multi-layered. In some embodiments, the thickness of the at least one second dielectric layer 18 is ranging from about 500 angstroms to about 1000 angstroms.

In some embodiments, a conductive via 19 is formed in the at least one first dielectric layer 16 and the at least one second dielectric layer 18. The conductive via 19 penetrates through the at least one first dielectric layer 16 and the at least one second dielectric layer 18 to electrically connect a portion of the first conductive wiring 14. The conductive via 19 is formed from conductive material such as metal or alloy. For example, the material of the first circuit layer includes copper, but not limited thereto.

As depicted in FIG. 2C, at least one third dielectric layer 20 is formed over the at least one second dielectric layer 18. In some embodiments, the dielectric constant of the at least one third dielectric layer 20 is lower than the dielectric constant of the at least one second dielectric layer 18. In some embodiments, the dielectric constant of the at least one third dielectric layer 20 is ranging from about 3.5 to about 4.5, but not limited thereto. In some embodiments, the material of the at least one third dielectric layer 20 may include silicon oxide, silicon carbide, zinc oxide, titanium oxide, tantalum oxide, combinations thereof or the like. In some embodiments, the thickness of the at least one third dielectric layer 20 is ranging from about 50 angstroms to about 600 angstroms. In some embodiments, the at least one third dielectric layer 20 is a single-layered structure. In some embodiments, the at least one third dielectric layer 20 includes a first dielectric 201 and a second dielectric 202 stacked to each other and formed from different dielectric materials. In some embodiments, the first dielectric 201 is configured to improve adhesion with the underlying second dielectric layer 18, and the second dielectric 202 is configured to improve adhesion with an overlying layer. In some embodiments, the thickness of the first dielectric 201 is ranging from about 50 angstroms to about 300 angstroms, and the thickness of the second dielectric 202 is ranging from about 50 angstroms to about 300 angstroms.

In some embodiments, a second low-k dielectric layer 22 is formed over the at least one third dielectric layer 20. The dielectric constant of the second low-k dielectric layer 22 is lower than the dielectric constant of the at least one third dielectric layer 20. In some embodiments, the second low-k dielectric layer 22 is a low-k dielectric or an extreme low-k dielectric having a dielectric constant equal to or less than about 3. In some embodiments, the material of the second low-k dielectric layer 22 may include, but is not limited to, a carbon-doped silicon oxide such as Black Diamond, CORAL or AURORA; a mixture of organic material and silicon oxide such as HOSP; Nanoglass; aluminum fluoride; bromine fluoride; combinations thereof; or other low-k dielectric materials. In some embodiments, the thickness of the second low-k dielectric layer 22 is ranging from about 100 angstroms to about 900 angstroms, but not limited thereto.

In some embodiments, a second conductive wiring 24 is formed over the at least one second dielectric layer 18. The second conductive wiring 24 is formed from conductive material such as metal or alloy. For example, the material of the second conductive wiring 24 includes copper, but not limited thereto. In some embodiments, the at least one third dielectric layer 20 and the second low-k dielectric layer 22 surround an edge of the second conductive wiring 24, and an upper surface of the second conductive wiring 24 is exposed from the second low-k dielectric layer 20. In some embodiments, a portion of the second conductive wiring 24 is electrically connected to the first conductive wiring 14 through the conductive via 19.

In some embodiments, at least one fourth dielectric layer 26 is formed over the second low-k dielectric layer 22 to form a semiconductor device 1. The dielectric constant of the at least one fourth dielectric layer 26 is lower than the dielectric constant of the second low-k dielectric layer 22. In some embodiments, the dielectric constant of the at least one fourth dielectric layer 26 is ranging from about 3.5 to about 4.5, but not limited thereto. In some embodiments, the material of the at least one fourth dielectric layer 26 may include silicon oxide, silicon carbide, zinc oxide, titanium oxide, tantalum oxide, combinations thereof or the like. In some embodiments, the thickness of the at least one fourth dielectric layer 26 is ranging from about 50 angstroms to about 600 angstroms. In some embodiments, the at least one fourth dielectric layer 26 includes a first dielectric 261 and a second dielectric 262 stacked to each other and formed from different dielectric materials. In some embodiments, the first dielectric 261 is configured to improve adhesion with the underlying second low-k dielectric layer 22, and the second dielectric 262 is configured to improve adhesion with an overlying layer. In some embodiments, the thickness of the first dielectric 261 is ranging from about 50 angstroms to about 300 angstroms, and the thickness of the second dielectric 262 is ranging from about 50 angstroms to about 300 angstroms.

The semiconductor device of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
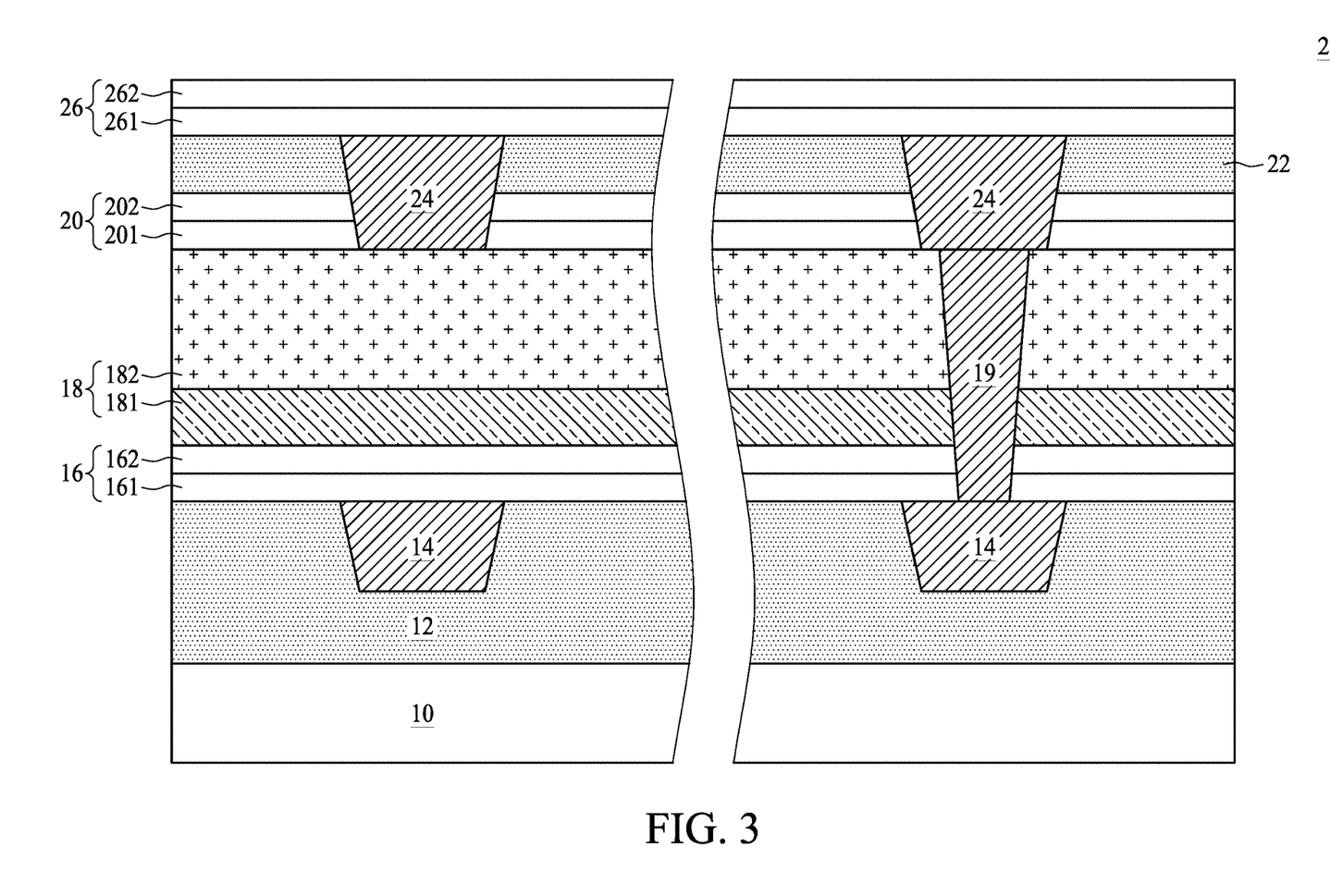
FIG. 3 is a schematic cross-sectional view of a semiconductor device according to one or more embodiments of the present disclosure.

FIG. 3 is a schematic cross-sectional view of a semiconductor device according to one or more embodiments of the present disclosure. As shown in FIG. 3, different from the semiconductor device 1 illustrated in FIG. 2C, the at least second dielectric layer 18 of the semiconductor device 2 includes a first layer 181 and a second layer 182 stacked to each other and formed from different dielectric materials. In some embodiments, the first dielectric 181 is configured to improve adhesion with the underlying first dielectric layer 16, and the second dielectric 182 is configured to improve adhesion with the overlying third dielectric layer 20.

Figure 4A:
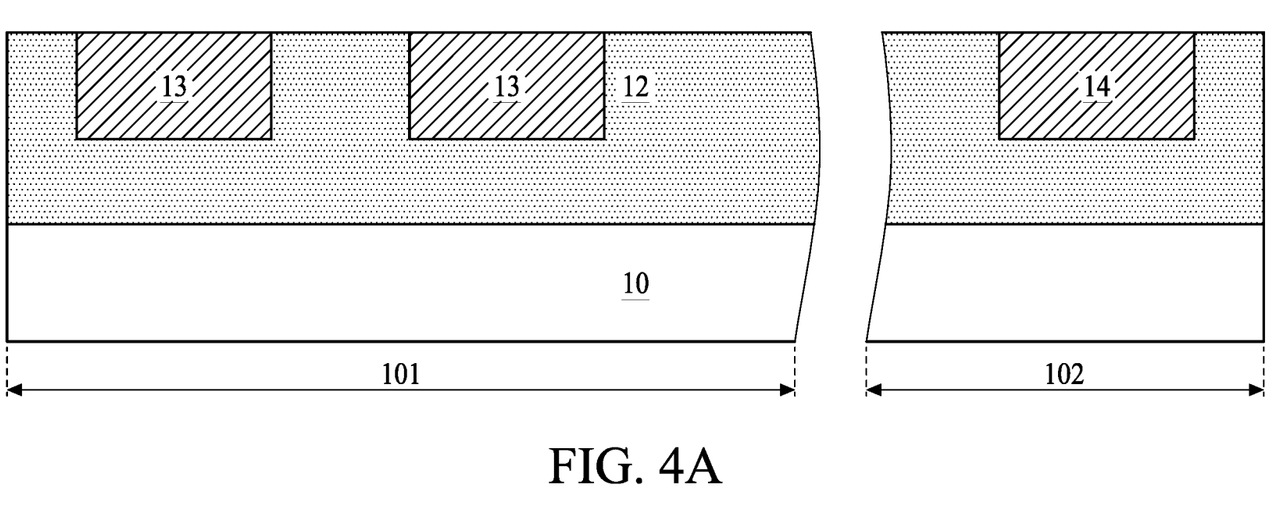
FIG. 4A, FIG. 4B, FIG. 4C and FIG. 4D are schematic views at one of various operations of manufacturing an semiconductor device according to one or more embodiments of the present disclosure.

FIG. 4A, FIG. 4B, FIG. 4C and FIG. 4D are schematic views at one of various operations of manufacturing an semiconductor device according to one or more embodiments of the present disclosure. As depicted in FIG. 4A, a substrate 10 is received. The substrate 10 includes a first region 101 and a second region 102. In some embodiments, the first region 101 is configured to accommodate an electronic device such as a memory device, and the second region 102 is configured to accommodate a logic device such as a stacked conductive wiring device.

In some embodiments, a first low-k dielectric layer 12 is formed over the substrate 10 in the first region 101 and in the second region 102. In some embodiments, the first low-k dielectric layer 12 is a low-k dielectric or an extreme low-k dielectric having a dielectric constant equal to or less than about 3. In some embodiments, the material of the first low-k dielectric layer 12 may include, but is not limited to, carbon-doped silicon oxide such as Black Diamond, CORAL or AURORA; mixture of organic material and silicon oxide such as HOSP; Nanoglass; aluminum fluoride; bromine fluoride; combinations thereof; or other low-k dielectric materials. In some embodiments, the thickness of the first low-k dielectric layer 12 is ranging from about 1000 angstroms to about 1500 angstroms, but not limited thereto.

In some embodiments, a first conductive structure 13 is formed in the first low-k dielectric layer 12 in the first region 101 and a first conductive wiring 14 is formed in the first low-k dielectric layer 12 in the second region 102. In some embodiments, the first conductive structure 13 and the first conductive wiring 14 can be formed by the same conductive layer. In some embodiments, the first low-k dielectric layer 12 surrounds an edge of the first conductive wiring 14 and an edge of the first conductive structure 13, and an upper surface of the first conductive wiring 14 and an upper surface of the first conductive structure 13 are exposed from the first low-k dielectric layer 12.

Figure 4B:
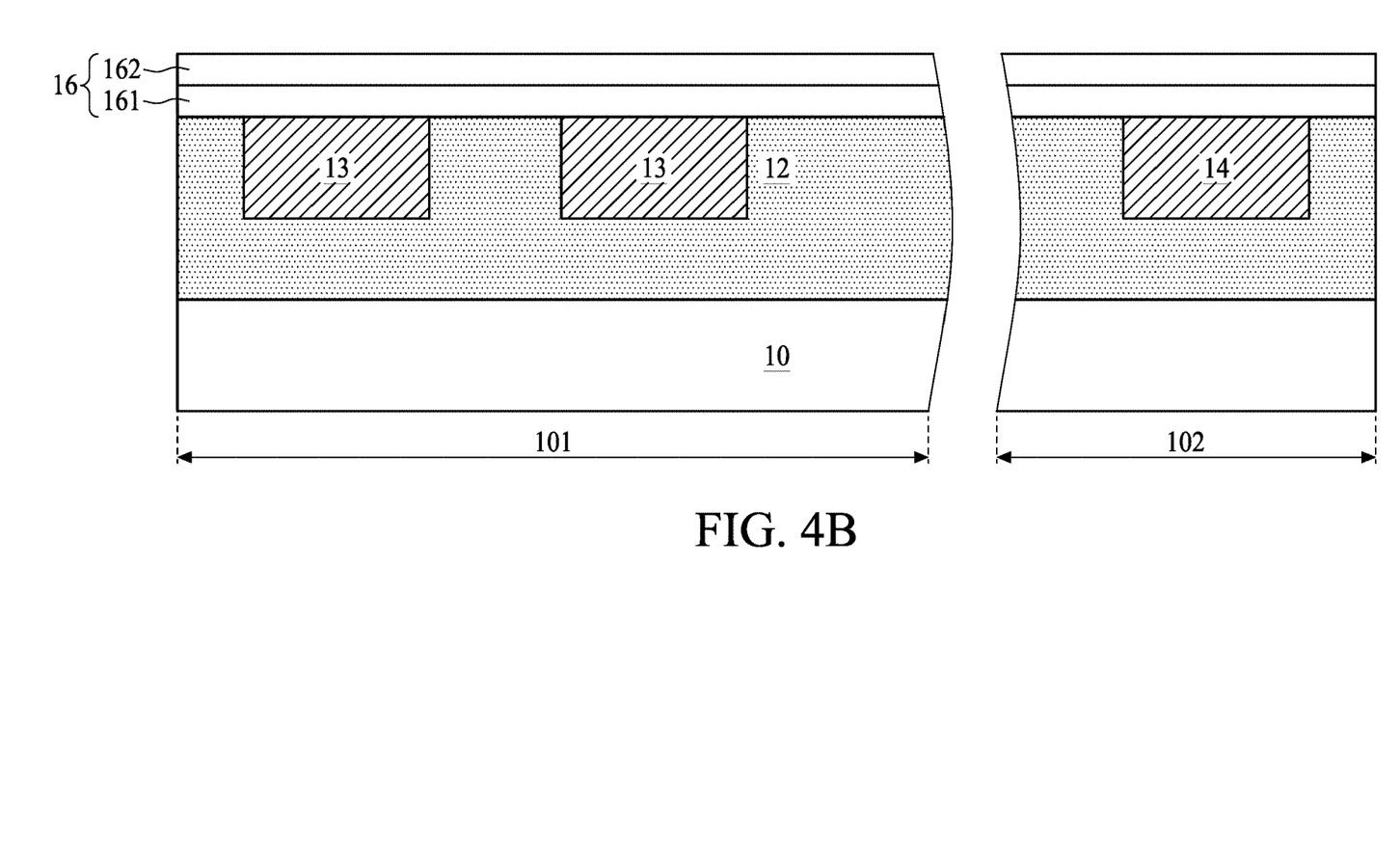

As depicted in FIG. 4B, at least one first dielectric layer 16 is formed over the first low-k dielectric layer 12. The dielectric constant of the at least one first dielectric layer 16 is higher than the dielectric constant of the first low-k dielectric layer 12. In some embodiments, the dielectric constant of the at least one first dielectric layer 16 is ranging from about 3.5 to about 4.5, but not limited thereto. In some embodiments, the material of the at least one first dielectric layer 16 may include silicon oxide, silicon carbide, zinc oxide, titanium oxide, tantalum oxide, combinations thereof, or the like. In some embodiments, the thickness of the at least one first dielectric layer 16 is ranging from about 50 angstroms to about 600 angstroms. In some embodiments, the at least one first dielectric layer 16 includes a first dielectric 161 and a second dielectric 162 stacked to each other and formed from different dielectric materials. In some embodiments, the first dielectric 161 is configured to improve adhesion with the underlying first low-k dielectric layer 12, and the second dielectric 162 is configured to improve adhesion with an overlying layer. In some embodiments, the thickness of the first dielectric 161 is ranging from about 50 angstroms to about 300 angstroms, and the thickness of the second dielectric 162 is ranging from about 50 angstroms to about 300 angstroms.

Figure 4C:
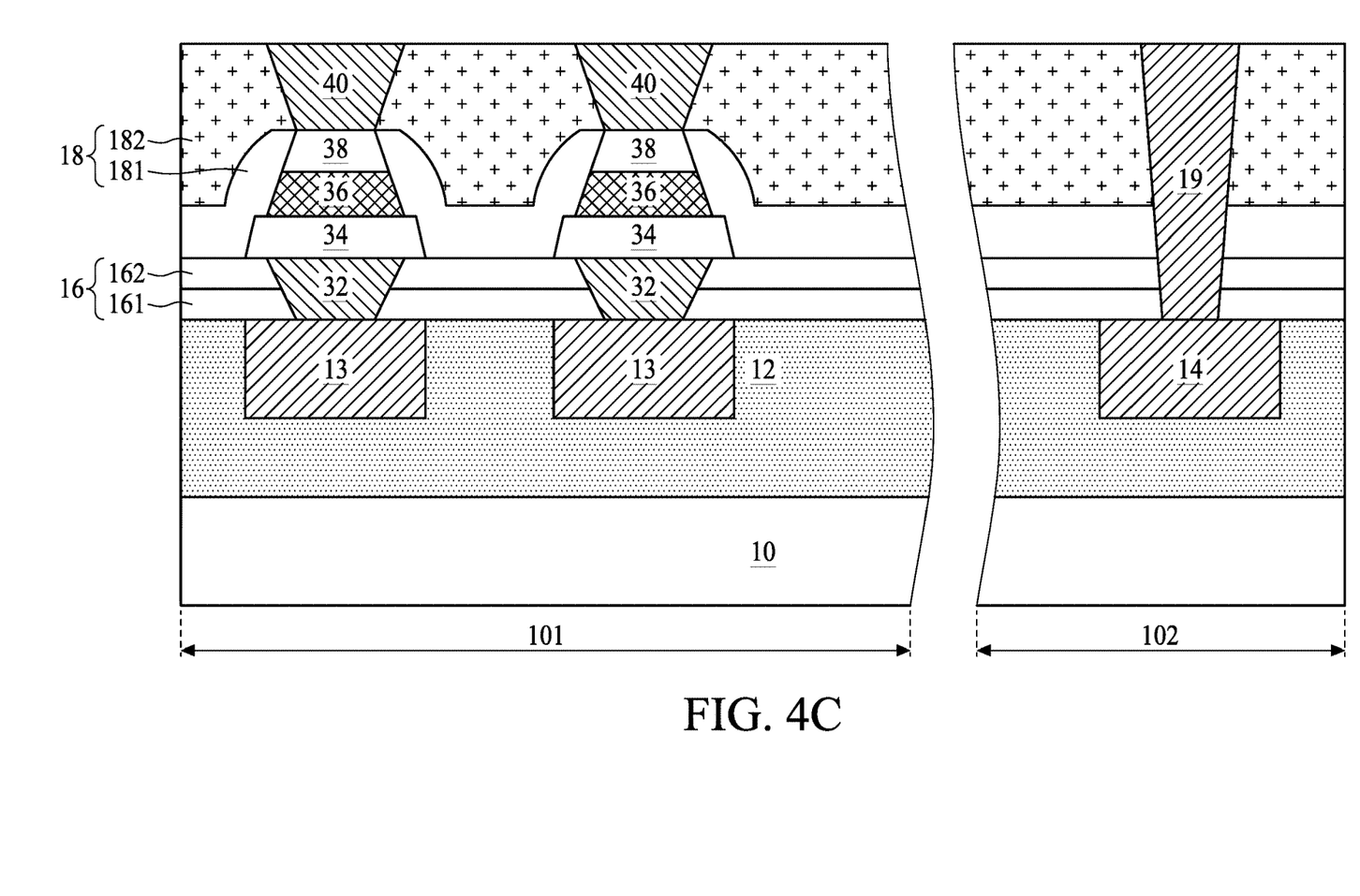

As depicted in FIG. 4C, an electronic device is formed in the first region 101. In some embodiments, the electronic device includes a memory device. In some embodiments, a magnetic random access memory (MRAM) device is exemplarily illustrated as an example. A bottom electrode via 32 is formed in the first region 101 and electrically connected to the exposed first conductive structure 141. A bottom electrode 34 is formed over the bottom electrode via 32. A magnetic tunnel junction (MJT) 36 is formed over the bottom electrode 34. A top electrode 38 is formed over the MJT 26. In some embodiments, at least one second dielectric layer 18 is formed over the at least one first dielectric layer 16. In some embodiments, the at least one second dielectric layer 18 includes a first layer 181 and a second layer 182. In some embodiments, the first layer 181 is configured as a spacer layer surrounding edges of the bottom electrode 34, the MJT 36 and the top electrode 38 of the MRAM device in the first region 101, and extending to the second region 102. In some embodiments, a top electrode via 40 is formed in the second layer 182 of the at least one second dielectric layer 18 of the first region 101. In some embodiments, a conductive via 19 is formed in the at least one first dielectric layer 16 and the at least one second dielectric layer 18 of the second region 102.

Figure 4D:
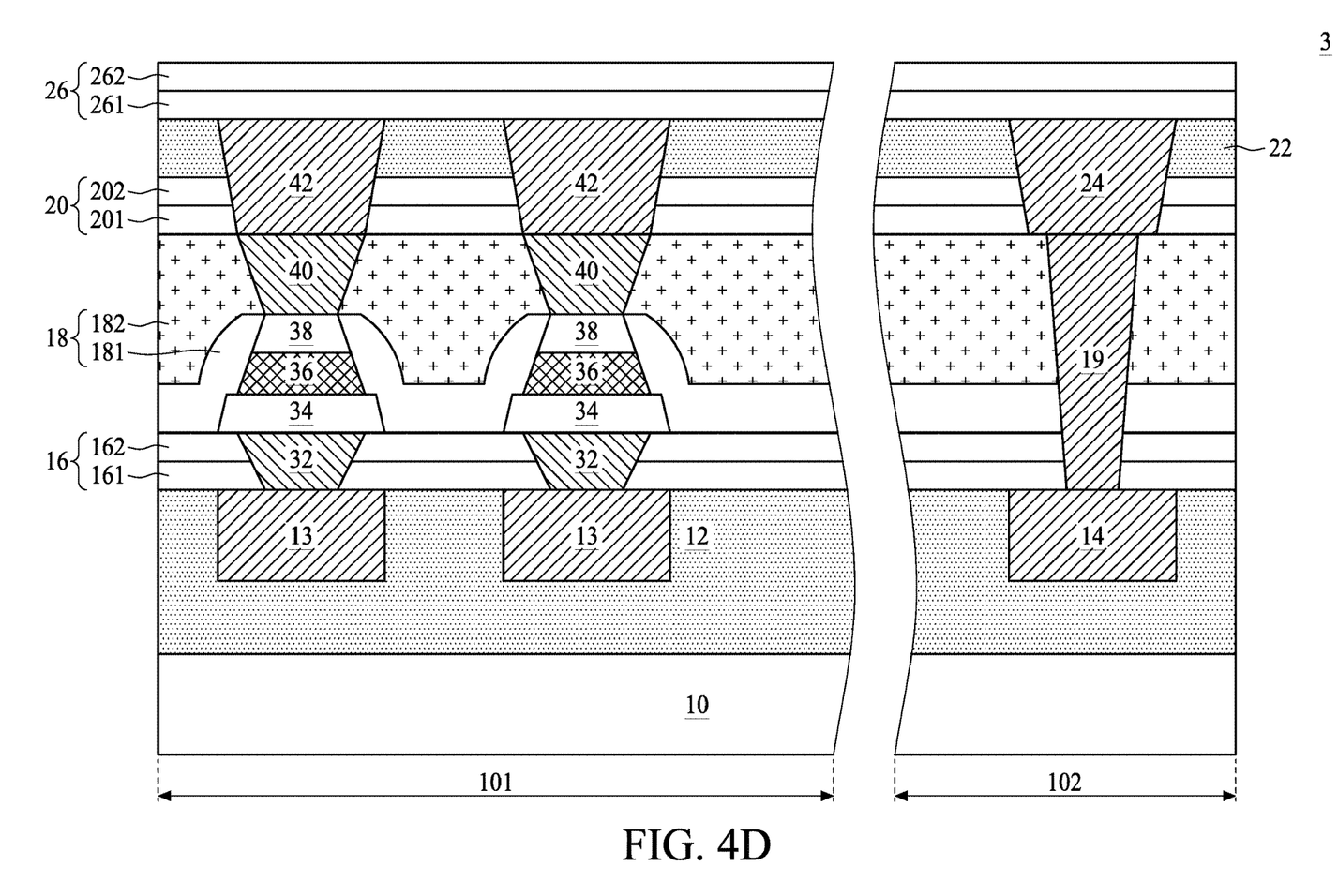

As depicted in FIG. 4D, at least one third dielectric layer 20 is formed over the at least one second dielectric layer 18. In some embodiments, the dielectric constant of the at least one third dielectric layer 20 is lower than the dielectric constant of the at least one second dielectric layer 18. In some embodiments, the dielectric constant of the at least one third dielectric layer 20 is ranging from about 3.5 to about 4.5, but not limited thereto. In some embodiments, the material of the at least one third dielectric layer 20 may include silicon oxide, silicon carbide, zinc oxide, titanium oxide, tantalum oxide, combinations thereof or the like. In some embodiments, the thickness of the at least one third dielectric layer 20 is ranging from about 50 angstroms to about 600 angstroms. In some embodiments, the at least one third dielectric layer 20 includes a first dielectric 201 and a second dielectric 202 stacked to each other and formed from different dielectric materials. In some embodiments, the thickness of the first dielectric 201 is ranging from about 50 angstroms to about 300 angstroms, and the thickness of the second dielectric 202 is ranging from about 50 angstroms to about 300 angstroms.

In some embodiments, a second low-k dielectric layer 22 is formed over the at least one third dielectric layer 20. The dielectric constant of the second low-k dielectric layer 22 is lower than the dielectric constant of the at least one third dielectric layer 20. In some embodiments, the second low-k dielectric layer 22 is a low-k dielectric or an extreme low-k dielectric having a dielectric constant equal to or less than about 3. In some embodiments, the material of the second low-k dielectric layer 22 may include, but is not limited to, a carbon-doped silicon oxide such as Black Diamond, CORAL or AURORA; a mixture of organic material and silicon oxide such as HOSP; Nanoglass; aluminum fluoride; bromine fluoride; combinations thereof; or other low-k dielectric materials. In some embodiments, the thickness of the second low-k dielectric layer 22 is ranging from about 100 angstroms to about 900 angstroms, but not limited thereto.

In some embodiments, a top electrode 42 is formed over the at least one second dielectric layer 18 of the first region 101, and a second conductive wiring 24 is formed over the at least one second dielectric layer 18 of the second region 102. In some embodiments, the top electrode 42 and the second conductive wiring 24 can be formed by the same conductive layer. In some embodiments, the at least one third dielectric layer 20 and the second low-k dielectric layer 22 surround an edge of the top electrode 42 and an edge of the second conductive wiring 24, and an upper surface of the top electrode 42 and an upper surface of the second conductive wiring 24 are exposed from the second low-k dielectric layer 20. In some embodiments, a portion of the second conductive wiring 24 is electrically connected to the first conductive wiring 14 through the conductive via 19.

In some embodiments, at least one fourth dielectric layer 26 is formed over the second low-k dielectric layer 22 to form a semiconductor device 3. The dielectric constant of the at least one fourth dielectric layer 26 is lower than the dielectric constant of the second low-k dielectric layer 22. In some embodiments, the dielectric constant of the at least one fourth dielectric layer 26 is ranging from about 3.5 to about 4.5, but not limited thereto. In some embodiments, the material of the at least one fourth dielectric layer 26 may include silicon oxide, silicon carbide, zinc oxide, titanium oxide, tantalum oxide, combinations thereof or the like. In some embodiments, the thickness of the at least one fourth dielectric layer 26 is ranging from about 50 angstroms to about 600 angstroms. In some embodiments, the at least one fourth dielectric layer 26 includes a first dielectric 261 and a second dielectric 262 stacked to each other and formed from different dielectric materials. In some embodiments, the thickness of the first dielectric 261 is ranging from about 50 angstroms to about 300 angstroms, and the thickness of the second dielectric 262 is ranging from about 50 angstroms to about 300 angstroms.

In some embodiments, the material and/or thickness of the dielectric layers such as the first dielectric layer 16 and the second dielectric layer 18 are configured to meet the capacitance requirement for a stacked conductive wiring device such as a logic device in a peripheral region. The dielectric layers such as the first dielectric layer 16 and the second dielectric layer 18 are not low-k dielectric layers, and thus can be used as dielectric for both the electronic device such as a MRAM device and a stacked conductive wiring device such as a logic device in a peripheral region. Accordingly, the operations of forming the dielectric layers for the electronic device such as a MRAM device and a stacked conductive wiring device such as a logic device in a peripheral region can be integrated, and thus the method for manufacturing a semiconductor device can be simplified.

Figure 5:
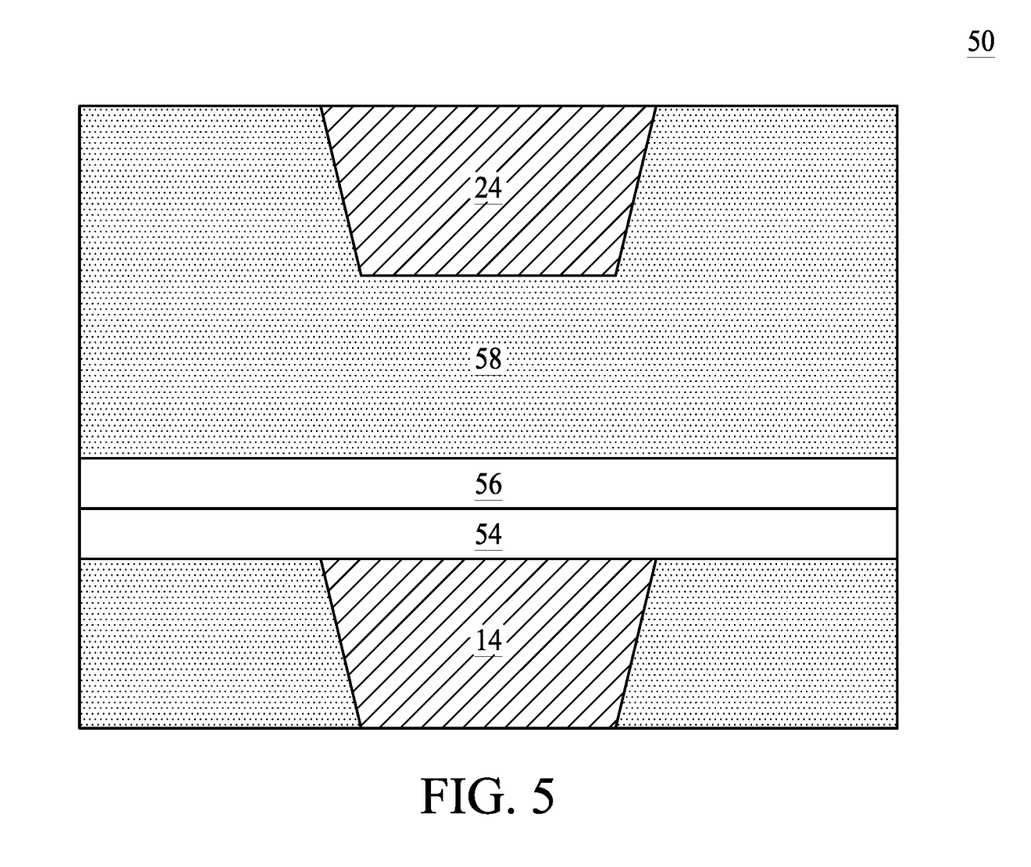
FIG. 5 is a schematic cross-sectional view of a semiconductor device according to a comparative embodiment of the present disclosure.

FIG. 5 is a schematic cross-sectional view of a semiconductor device according to a comparative embodiment of the present disclosure. As shown in FIG. 5, the semiconductor device 50 of the comparative embodiment includes a first conductive wiring 14, a first dielectric layer 54, a second dielectric layer 56, a low-k dielectric layer 58 and a second conductive wiring 24. The dielectric constant of the low-k dielectric layer 58 is lower than 3, and the dielectric constant of the first dielectric layer 54 and the second dielectric layer 56 is ranging from 3.5 to 4.5. The thickness of the first dielectric layer 54 is between 50 angstroms and 300 angstroms, and the thickness of the second dielectric layer 56 is between 50 angstroms and 300 angstroms. The thickness of the low-k dielectric layer 58 under the second conductive wiring 60 i.e. the gap between the lower surface of the second conductive wiring 60 and the upper surface of the second dielectric layer 56 is between 200 angstroms and 300 angstroms.

Figure 6:
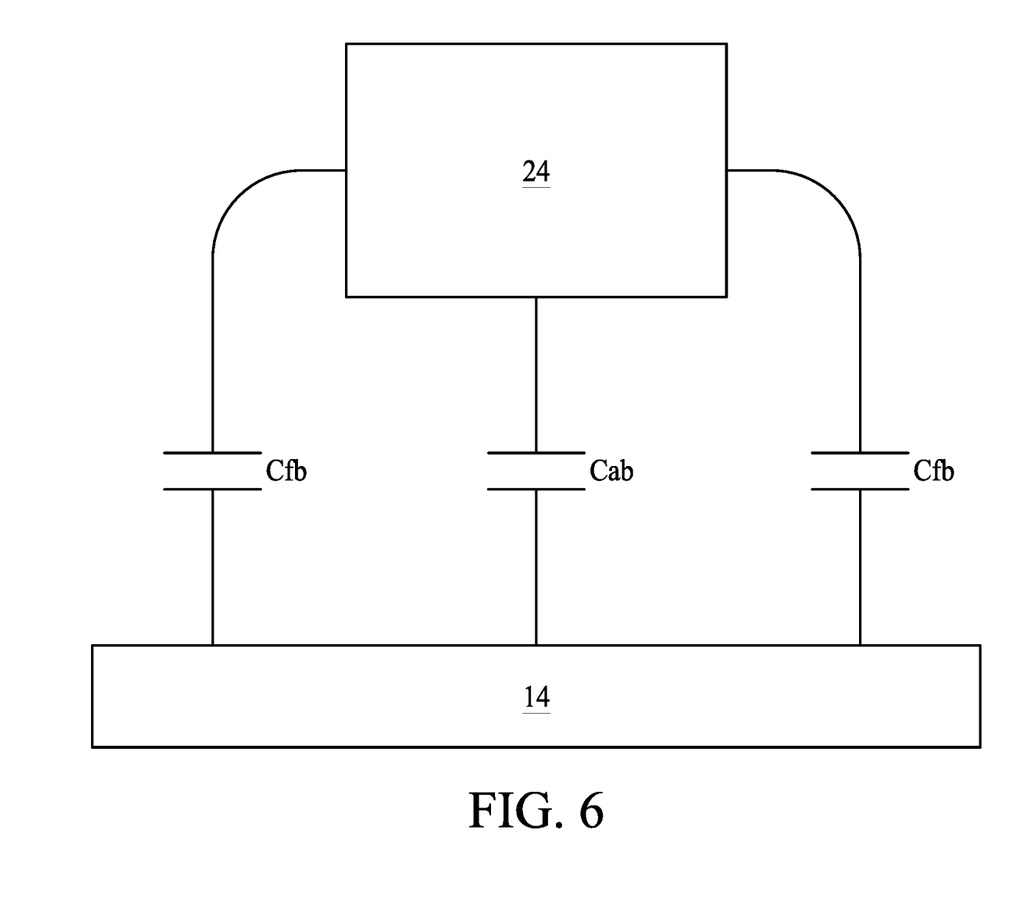
FIG. 6 is an equivalent circuit diagram of a stacked conductive wiring device.

FIG. 6 is an equivalent circuit diagram of a stacked conductive wiring device. As shown in FIG. 6, a capacitance Cab exists between the first conductive wiring 14 and the second conductive wiring 24 in a perpendicular direction, and two capacitances Cfb exist between the first conductive wiring 14 and the second conductive wiring 24 in two oblique directions, respectively. Refer to Table 1. Table 1 shows a simulation of capacitance between the first conductive wiring and the second conductive wiring.

TABLE 1

| | Thickness of second di-electric layer (Å) | Overall capacitance (Cab + 2*Cfb) (fF/um) | Cab(fF/um) | Cfb ab(fF/um) |
|---|---|---|---|---|
| Comparative embodiment | | 4.27E-02 | 1.73E-02 | 1.27E-02 |
| Embodiments of the present disclosure | 811 | 4.28E-02 | 1.62E-02 | 1.33E-02 |
| | 761 | 4.47E-02 | 1.71E-02 | 1.38E-02 |
| | 746 | 4.54E-02 | 1.73E-02 | 1.40E-02 |
| Offset | 811 | 0.2% | −6.4% | 4.7% |
| | 761 | 4.7% | −1.2% | 8.7% |
| | 746 | 6.3% | 0.0% | 10.2% |

From the simulation result in Table 1, the dielectric layers such as the first dielectric layer and the second dielectric layer, which are not low-k dielectric materials, are able to generate a capacitance between the first conductive wiring and the second conductive wiring similar to a low-k dielectric material. The first dielectric layer and the second dielectric layer not only can meet the capacitance requirement for a stacked conductive wiring device such as a logic device in a peripheral region, but also can be integrated with the inter-metal dielectric (IMD) in the electronic device such as a MRAM device. Accordingly, the method for manufacturing a semiconductor device can be simplified, and the planarization of the semiconductor device is improved.

In one exemplary aspect, a semiconductor device is provided. The semiconductor device includes a memory cell and a first dielectric layer over the memory cell. The memory device includes a bottom electrode, a top electrode over the bottom electrode, and a MTJ between the top electrode and the bottom electrode. The first dielectric layer surrounds sidewalls of the bottom electrode entirely, sidewalls of the MTJ entirely, and sidewalls of the top electrode entirely.

In another aspect, a semiconductor device is provided. The semiconductor device includes a first dielectric layer, a second dielectric layer over the first dielectric layer, a memory cell, and a spacer layer. The memory cell includes a bottom electrode, a top electrode and a MTJ between the top electrode and the bottom electrode. The spacer layer is between the memory cell and the second dielectric layer, and between the first dielectric layer and the second dielectric layer. Sidewalls of the memory cell are entirely in contact with the spacer layer, and a top surface of the memory cell is free of the spacer layer.

In yet another aspect, a semiconductor device is provided. The semiconductor device includes a first dielectric layer, a second dielectric layer over the first dielectric layer and the first conductive structure, a first adhesive layer between the first dielectric layer and the second dielectric layer, a third dielectric layer over the second dielectric layer, a second adhesive layer between the second dielectric layer and the third dielectric layer, a fourth dielectric layer over the third dielectric layer, a third adhesive layer between the third dielectric layer and the fourth dielectric layer, and a fifth dielectric layer over the fourth dielectric layer. A dielectric constant of the second adhesive layer is greater than dielectric constants of the first dielectric layer, the second dielectric layer, the fourth dielectric layer, the fifth dielectric layer, the first adhesive layer, and the third adhesive layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a bottom electrode via;
a top electrode via over the bottom electrode via;
a memory cell between the bottom electrode via and the top electrode via comprising:
a bottom electrode;
a top electrode over the bottom electrode; and
a magnetic tunnel junction (MTJ) between the top electrode and the bottom electrode;
a first dielectric layer over the memory cell;
a second dielectric layer over the first dielectric layer; and
a via structure separated from the memory cell, wherein a height of the via structure is substantially equal to a sum of a height of the bottom electrode via, a height of the memory cell and a height of the top electrode via;
wherein the first dielectric layer substantially surrounds sidewalls of the bottom electrode entirely, sidewalls of the MTJ entirely, and sidewalls of the top electrode entirely, the first dielectric layer at least partially surrounds a first portion of the via structure, the second dielectric layer at least partially surrounds a second portion of the via structure, and a height of the second portion of the via structure is greater than a height of the first portion of the via structure.

2. The semiconductor device of claim 1, wherein the first dielectric layer is between the second dielectric layer and the memory cell.

3. The semiconductor device of claim 1, further comprising:
a first conductive wiring under the memory cell and the first dielectric layer, wherein the bottom electrode via electrically connects the first conductive wiring to the bottom electrode.

4. The semiconductor device of claim 3, further comprising a third dielectric layer surrounding sidewalls of the first conducting wiring substantially entirely.

5. The semiconductor device of claim 4, further comprising a fourth dielectric layer surrounding sidewalls of the bottom electrode via substantially entirely, and at least partially surrounding a third portion of the via structure.

6. The semiconductor device of claim 3, further comprising a second conductive wiring over the memory cell and the first dielectric layer, wherein the top electrode via electrically connects the top electrode to the second conductive wiring.

7. The semiconductor device of claim 6, further comprising a fifth dielectric layer surrounding the second conductive wiring substantially entirely.

8. A semiconductor device, comprising:
a first dielectric layer;
a second dielectric layer over the first dielectric layer;
a bottom electrode via in the first dielectric layer;
a top electrode via in the second dielectric layer;
a memory cell between the bottom electrode via and the top electrode via comprising:
a bottom electrode;
a top electrode over the bottom electrode; and a magnetic tunnel junction (MTJ) between the top electrode and the bottom electrode;
a spacer layer between the memory cell and the second dielectric layer, and between the first dielectric layer and the second dielectric layer; and
a via structure separated from the memory cell, wherein a height of the via structure is substantially equal to a sum of a height of the bottom electrode via, a height of the memory cell and a height of the top electrode via,
wherein sidewalls of the memory cell are entirely in contact with the spacer layer, and
a top surface of the memory cell is free of the spacer layer,
wherein the first dielectric layer at least partially surrounds a first portion of the via structure, the spacer layer at least partially surrounds a second portion of the via structure, the second dielectric layer at least partially surrounds a third portion of the via structure, and a height of the third portion is greater than a height of the first portion and greater than a height of the second portion.

9. The semiconductor device of claim 8, wherein dielectric constants of the second dielectric layer and the spacer layer are higher than a dielectric constant of the first dielectric layer.

10. The semiconductor device of claim 8, further comprising:
a first conductive wiring under the memory cell and the bottom electrode via; and
a second conductive wiring over the memory cell and the top electrode via.

11. The semiconductor device of claim 10, wherein the first conductive wiring is electrically connected to the bottom electrode through the bottom electrode via, and the second conductive wiring is electrically connected to the top electrode through the top electrode via.

12. The semiconductor device of claim 10, further comprising:
a third dielectric layer, wherein the first conductive wiring is disposed in the third dielectric layer; and
a fourth dielectric layer, wherein the second conductive wiring is disposed in the fourth dielectric layer.

13. The semiconductor device of claim 12, wherein a dielectric constant of the first dielectric layer is higher than a dielectric constant of the third dielectric layer.

14. The semiconductor device of claim 12, wherein a dielectric constant of the fourth dielectric layer is lower than dielectric constants of the second dielectric layer and the spacer layer.

15. A semiconductor device, comprising:
a first dielectric layer;
a second dielectric layer over the first dielectric layer;
a first adhesive layer between the first dielectric layer and the second dielectric layer;
a bottom electrode via in the first adhesive layer and the second dielectric layer;
a third dielectric layer over the second dielectric layer;
a top electrode via in the third dielectric layer;
a memory cell between the bottom electrode via and the top electrode;
a second adhesive layer between the third dielectric layer and the second dielectric layer;
a fourth dielectric layer over the third dielectric layer;
a third adhesive layer between the third dielectric layer and the fourth dielectric layer;
a fifth dielectric layer over the fourth dielectric layer; and
a via structure in the first adhesive layer, the second dielectric layer, the second adhesive layer and the third dielectric layer, wherein the via structure is separated from the bottom electrode via, the memory cell and top electrode via,
wherein a dielectric constant of the second adhesive layer is greater than dielectric constants of the first dielectric layer, the second dielectric layer, the fourth dielectric layer, the fifth dielectric layer, the first adhesive layer, and the third adhesive layer, and a height of the via structure is substantially equal to a sum of a height of the bottom electrode via, a height of the memory cell and a height of the top electrode via.

16. The semiconductor device of claim 15, wherein the memory cell is between the second adhesive layer and the second dielectric layer, wherein sidewalls of the memory cell are in contact with the second adhesive layer, and portions of a bottom of the memory cell are in contact with the second dielectric layer.

17. The semiconductor device of claim 15, wherein the memory cell comprises:
a bottom electrode;
a top electrode; and
a MTJ between the bottom electrode and the top electrode,
wherein sidewalls of the bottom electrode, sidewalls of the top electrode and sidewalls of the MTJ are in contact with second adhesive layer, and a top surface of the top electrode is free of the second adhesive layer.

18. The semiconductor device of claim 15, further comprising:
a first conductive wiring in the first dielectric layer, wherein the first conductive wiring is electrically connected to the memory cell through the bottom electrode via.

19. The semiconductor device of claim 15, further comprising
a second conductive wiring in the fourth dielectric layer, the third adhesive layer and the fifth dielectric layer,
wherein the second conductive wiring is electrically connected to the memory cell through the top electrode via.

20. The semiconductor device of claim 15, wherein a dielectric constant of the second adhesive layer and a dielectric constant of the third dielectric layer are greater than a dielectric constant of the second dielectric layer and a dielectric constant of the first adhesive layer.

* * * * *